United States Patent [19]

Shimada et al.

[11] 3,980,899
[45] Sept. 14, 1976

[54] WORD LINE DRIVER CIRCUIT IN MEMORY CIRCUIT

[75] Inventors: Shunji Shimada; Tsuneo Ito, both of Kodaira, Japan

[73] Assignee: Hitachi, Ltd., Japan

[22] Filed: Feb. 6, 1975

[21] Appl. No.: 547,494

[30] Foreign Application Priority Data
Oct. 30, 1974 United Kingdom............... 46957/74

[52] U.S. Cl.............................. 307/238; 307/270; 307/DIG. 5; 340/173 R; 340/173 FF
[51] Int. Cl.²..................... H03K 5/18; G11C 7/00; H03K 3/353
[58] Field of Search ........... 307/238, 251, 270, 304, 307/DIG. 5; 340/173 R, 173 FF

[56] References Cited
UNITED STATES PATENTS

| | | | |
|---|---|---|---|
| 3,702,926 | 11/1972 | Picciano et al. | 307/205 X |
| 3,702,990 | 11/1972 | Ross | 307/238 X |
| 3,719,932 | 3/1973 | Cappon | 307/238 X |
| 3,824,564 | 7/1974 | Wegener | 307/238 X |
| 3,846,768 | 11/1974 | Krick | 307/304 X |
| 3,870,901 | 3/1975 | Smith et al. | 340/173 FF X |

OTHER PUBLICATIONS

Atwood, "Field Effect Transistor Circuits"; *IBM Tech. Discl. Bull.;* vol. 6, No. 9, pp. 91–92; 2/1964.

*Primary Examiner*—John S. Heyman
*Assistant Examiner*—L. N. Anagnos
*Attorney, Agent, or Firm*—Craig & Antonelli

[57] ABSTRACT

For driving a plurality of memory cells, a driver circuit, connected to the word driver line of the memory cells, includes a resistive connection, connected between the word line and ground potential, for preventing the potential of the word line from floating. The driver circuit includes an enhancement-type switching MOSFET and a depletion type resistor MOSFET connected in series. By virtue of the connection of a gate of the depletion type MOSFET, the depletion type MOSFET is always turned on so that whether or not the switching type enhancement MOSFET is turned on, the common connection between the switching MOSFET and the resistive MOSFET will always be at a prescribed potential thereby preventing the word driver line from floating.

8 Claims, 5 Drawing Figures

WORD LINE DRIVER CIRCUIT IN MEMORY CIRCUIT

BACKGROUND OF THE INVENTION

1. Field of the Invention

The present invention relates to memory circuits and, more particularly, to word line driver circuits which are connected to the output terminals of decoder circuits therefor.

2. Description of the Prior Art

For driving the word line in an array of memory cells, which are selectively addressed by decoder circuits, there are generally employed two types of driver circuits.

A first type is a push-pull buffer type depicted in FIG. 1. The word line driver circuit is shown in broken lines 5 connected between a decoder circuit 1 and an array of memory cells 4. The driver circuit includes a pair of MOSFETs 2 and 3 connected between potential — VDD and ground. To the gate electrodes of these MOSFETs the output of the decoder circuit is supplied directly and through an inverter 6, as shown.

For this arrangement, upon the supply of a gating potential at the output of decoder 1 for turning MOSFET 2 on, the MOSFET 2 will be rendered conductive, while because of inverter 6, MOSFET 3 will be turned off. With MOSFET 2 having been rendered conductive, the potential supplied to the drain thereof (−VDD) will be coupled to the word line for supply to the memory cell array 4.

On the other hand, in the absence of a gating potential supplied at the output of a decoder circuit 1, MOSFET 2 will be turned off by the output level (0 volts) from the decoder circuit 1, which, by virtue of inverter circuit, will cause a sufficient gating potential to energize the MOSFET 3. With MOSFET 3 turned on, the common reference potential (ground) will be applied to the word line 7; thereby preventing the word line driver circuit 5 from floating.

With this type of arrangement, however, an inverter circuit, which serves no function other than to provide an inverted signal, is required and MOSFET 3 operates in the dependence upon the output of the decoder circuit 1. As a result, the integration density of the overall memory circuit suffers.

Another prior art type of word line driver circuit arrangement employs a pair of MOSFETs with a chip-enable signal and an inverted chip-enable signal supplied to both MOSFETs. Such a circuit is illustrated on page 6 of the publication "Silicon Gate MOS LSI RAM 1103" published by Intel Corporation, 1971, particularly Page 6 thereof. Also, this type of circuit is described in the manual "Semiconductor Memories", Bulletin CW-806, Videotape Course Workbook, by Texas Instruments Incorporated, 1972, particularly Pages 5–17 thereof.

This circuit is illustrated in FIG. 2 of the drawings wherein, as in the circuit of FIG. 1, a pair of MOSFETs 2 and 3 are connected between a decoder circuit 1 and a memory cell array 4. MOSFET 2, rather than being connected to a fixed potential has its drain connected to receive a control signal CE (chip-enable), while a not-chip-enable signal $\overline{CE}$ is applied to the gate of MOSFET 3. These signals will be supplied simultaneously to the word driver circuits for selectively turning MOSFET 2 on while MOSFET 3 is turned off and vice versa. This circuit is advantageous relative to the circuit of FIG. 1 in that the integration density can be improved by elimination of the inverter circuit 6.

However, the memory cell array 4, coupled to the driver circuit 5, in the arrangement of FIG. 2, is subject to mis-operation where the word line 7, which has not been selected by the decoder circuit, floats, and accordingly, may pick up noise sufficient to select a memory cell. Namely, in the absence of a gating potential at the output of the decoder circuit 1, MOSFET 2 will be turned off, and accordingly, if the $\overline{CE}$ input to MOSFET 3 is inverted, namely, the gate of MOSFET 3 is not turned on, the word line supplied to the memory cell array 4 will float.

When the potential of the floating word line 7 reaches or exceeds the level of the address signal required for accessing a memory cell due to noise, a gate of one of the circuits within the memory cell may be rendered conductive thereby causing misoperation of the circuit and an inadvertent addressing of an undesired memory cell.

Accordingly, while the circuit of FIG. 2 may enhance the density of integration of the memory circuit proper, it does have its drawbacks in that it is subject to misoperation.

SUMMARY OF THE INVENTION

In accordance with the present invention, an improved memory circuit, particularly an improved driver circuit for a memory, is provided which permits both an increase in the density of integration and does not suffer from misoperation due to noise.

To this end, within the driver circuit which is connected between the decoder and the memory cell array, an enhancement MOSFET and a depletion MOSFET are connected in series between a source of potential for addressing the memory cells and the source of reference potential. The depletion type MOSFET is so connected as to be permanently turned on. Through this arrangement, even when the output of the decoder circuit turns the enhancement type switching MOSFET off, the depletion type MOSFET will supply ground potential to the work line, thereby preventing the same from floating and, accordingly, preventing the memory cell array from being addressed due to noise.

DETAILED DESCRIPTION

Figure 1:
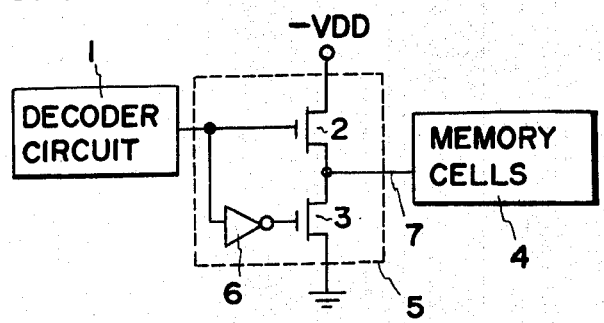
FIGS. 1 and 2 depict prior art types of memory driver circuits.
Figure 2:
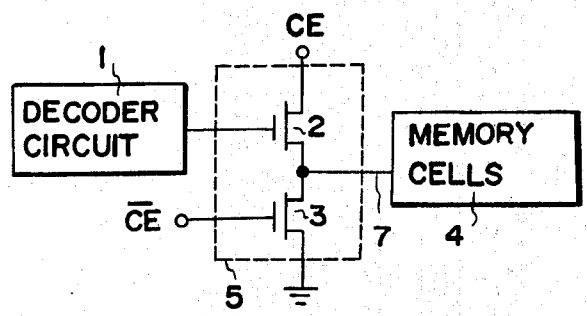
Figure 3:
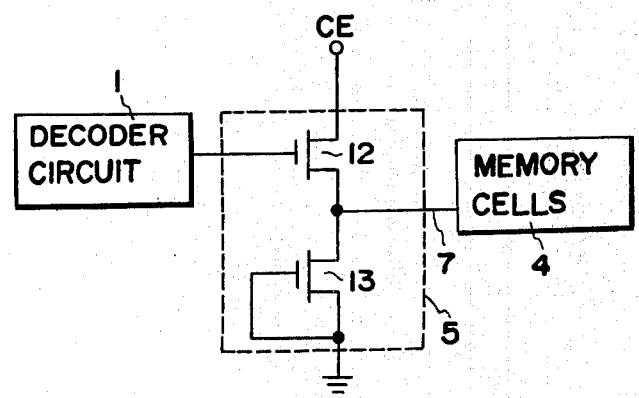
FIG. 3 is a circuit diagram of one embodiment of the present invention.

In FIG. 3, which is a circuit diagram of an embodiment of the present invention, the memory driver circuit, which is connected between the decoder circuit 1 and the memory cell array 4 is made up of a pair of MOSFETs 12 and 13. MOSFET 12 is a P-type enhancement type MOSFET, the drain of which is connected to receive a memory cell address or control signal CE. The gate electrode of MOSFET 12 is connected to the output of the decoder circuit 1, while the source electrode thereof is connected to the word line which is supplied to the memory cell array 4 and to the drain electrode of MOSFET 13. MOSFET 13 is a depletion P-type MOSFET which acts as a load resistance, the source electrode of which is connected to ground and to the gate electrode thereof.

In operation, when the decoder circuit 1 supplies a gating potential for accessing the memory cells 4 connected to the word line 7 of the driver circuit 5, MOSFET 12 will be turned on, thereby coupling the control signal CE to the word line. MOSFET 13 is permanently turned on by virtue of the connection of its gate to ground potential and acts as a load resistance between the word line and ground. The potential supplied to the word line is determined by the ratio of the resistances between the "on" resistance of the MOSFET 12 and the permanent load resistance provided by MOSFET 13. The on-resistance of MOSFET 12 is about 60 Ω, while the load resistance of MOSFET 13 is about $4 \times 10^3$ Ω. Thus, while MOSFETs 12 and 13 act as a voltage divider for the control signal CE, due to the larger load resistance provided by MOSFET 13, the potential on the word line due to the control signal CE is sufficient to energize the memory cells, selectively addressed by the decoder circuit through the driver circuit.

Now, on the other hand, when the decoder circuit 1 provides no output so as to prevent the MOSFET 12 from being turned on, relative to the resistance of MOSFET 13, MOSFET 12 is essentially an open circuit so that the word line 7 effectively sees ground potential. By virtue of MOSFET 13 being permanently turned on, if an electric charge due to noise, etc. tends to charge the floating gate capacitance of the word line, which has not been selected by virtue of no output of the decoder circuit, this electric charge will be prevented from building up and will leak to ground through the turned-on depletion MOSFET 13, thereby preventing the memory cells 4 from being misaddressed.

Figure 4:
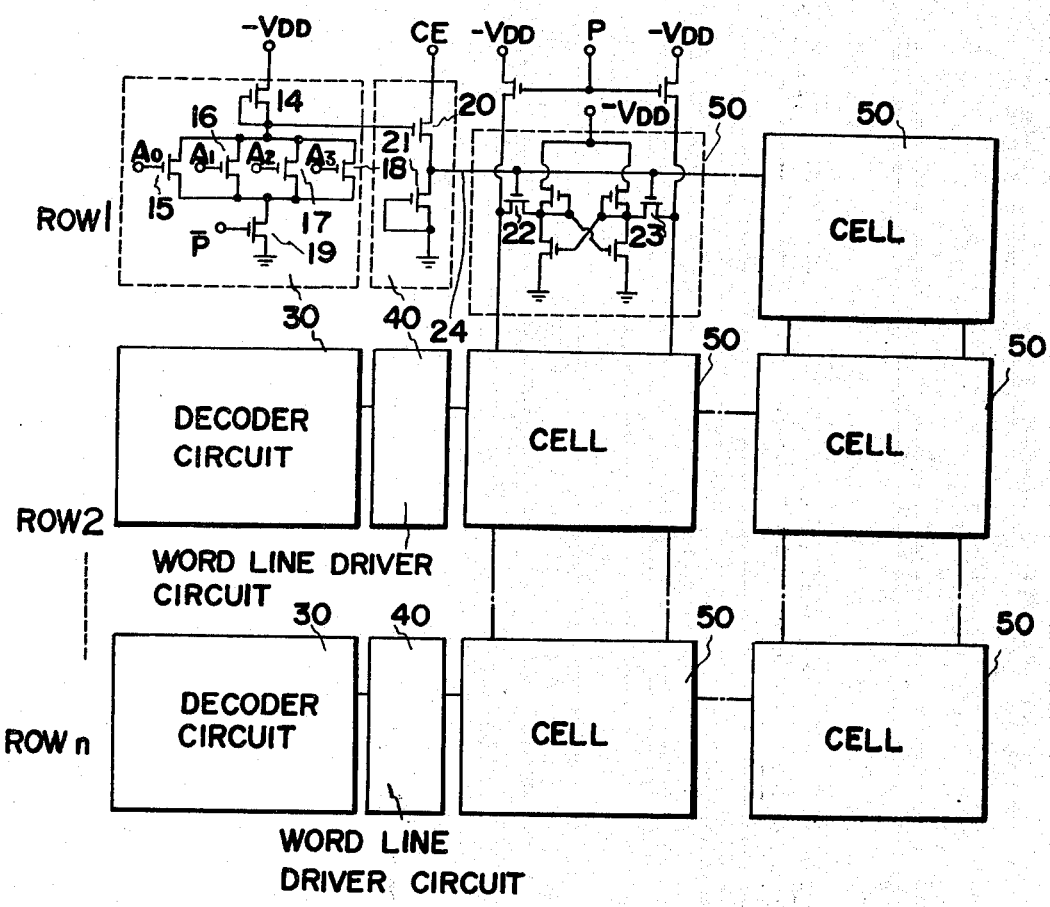
FIG. 4 is a detailed circuit diagram for explaining the operation of the decoder circuit and the memory circuit employing the driver circuit of the present invention.

In FIG. 4, there is a detailed illustration of a memory circuit embodying the present invention. In FIG. 4, the decoder circuit 30 of row 1 of the overall memory circuit array comprises MOSFETs 14–19. MOSFETs 15–18 are P-type enhancement MOSFETs and are connected in parallel with each other. The respective gates $A_0$–$A_3$ thereof are connected to receive address signals. MOSFET 14 is a depletion P-type and has its source electrode connected to the commonly connected drains of MOSFETs 15 and 18 and to the gate electrode of MOSFET 20 included within the driver circuit 40. Similarly, the drain electrode of P-type enhancement MOSFET 19 is connected between a source of reference potential (ground) and the commonly connected source electrodes of MOSFETs 15–18. The drain electrode of MOSFET 14 is coupled to a voltage source VGG (− 10 Volts e.g.) The gate electrode of MOSFET 19 is supplied with a pulse signal $\overline{P}$.

The word line driver circuit 40, proper, is made up of enhancement P-type MOSFET 20 and depletion P-type MOSFET 21 connected in series therewith in a manner shown in FIG. 3, discussed previously. The common connection of MOSFETs 20 and 21 is connected to word line 24, for driving row 1 of memory cells 50, the word line being connected to the gate electrodes of MOSFETs 22 and 23 in each respective cell. Information is written into or read out from the respective memory cells when MOSFETs 22 and 23 are addressed and, thereby, turned on. For each row, a respective decoder and word line driver circuit are employed.

In operation, assuming that row 1 has been selected each of the MOSFETs 15–18 will have its gate supplied with an address input, so as to turn each of these MOSFETs off. With each of MOSFETs 15–18 turned off, the voltage supplied to the drain of MOSFET 14 (− VGG) will be supplied to the output terminal of the decoder circuit 30 of row 1. As a result, MOSFET 20 will be turned on, thereby coupling a control signal CE of − 10 Volts to the drain electrode of MOSFET 20. In turn, the word line 24 will supply an appropriate factor of the − 10 Volts by virtue of the voltage dividing resistances of turned on MOSFET 20 and permanently turned on MOSFET 21 to the gate electrodes of MOSFETs 22 and 23, thereby selectively addressing the memory cells 50 of row 1.

On the other hand, if row 1 is not selected, for example, when MOSFET 15 has been turned on, while an inverted pulse signal $\overline{P}$ of − 10 Volts is applied to the gate electrode of MOSFET 19, the output of decoder circuit 30 drops to ground potential through MOSFETs 15 and 19. As a result, MOSFET 20 will be turned off, so that the potential of the control signal input CE will not be applied to the word line 24.

On the other hand, since MOSFET 21 is permanently turned on, the potential at the word line 22 is substantially grounded thereby causing MOSFETs 22 and 23 to be turned off.

Thus, since the word line 24 cannot float, misoperation of the cells 50 is prevented.

In the embodiment described in FIG. 3, each of MOSFETs 12 and 13 has been indicated to be of the P-type. However, N-type MOSFETs may be employed with appropriate voltage polarities reversed.

Figure 5:
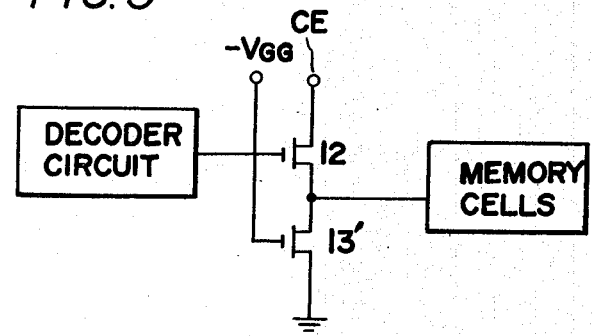
FIG. 5 is a circuit diagram of another embodiment of the present invention.

Furthermore, in the embodiment of FIG. 5, in place of a depletion P-type MOSFET 13, employed in FIG. 3, an enhancement P-type MOSFET 13' may be used as the load resistance. However, the gate electrode thereof is not connected in common with the source to ground, but is connected to a permanent voltage supply − VGG so that MOSFET 13' will be turned on permanently.

In place of MOSFETs for the load resistances, a linear resistance such as a diffused resistance or a thin film resistance formed on an insulating film may be employed. The resistance value thereof, of course, should be more than seven times the "on" resistances of MOSFET 12.

While we have shown and described several embodiments in accordance with the present invention, it is understood that the same is not limited thereto but is susceptible of numerous changes and modifications as known to a person skilled in the art, and We therefore, do not wish to be limited to the details shown and described herein but intend to cover all such changes and modifications as are obvious to one of ordinary skill in the art.

What is claimed is:

1. In a memory circuit including:
   at least one memory cell for storing information;
   a first circuit for supplying memory cell selection signals for accessing a memory cell;
   an address signal source for generating an address signal to control said at least one memory cell; and
   a driver circuit, connected between said first circuit and said at least one memory cell, for selectively gating said address signal to said at least one memory cell, in response to said selection signals;

the improvement wherein said driver circuit comprises switching means, connected between said first circuit and said at least one memory cell, for selectively switching said address signal into said memory cells, and bias means, coupled between the connection point of said switching means and a source of reference potential, comprising together with said switching means a source follower, and operating independently of the output of said first circuit, for preventing the potential of said connection point from floating at least when said switching means is turned off.

2. The improved memory circuit according to claim 1, wherein said switching means comprises a first insulated gate field effect transistor, which is coupled between said address signal source and said bias means, the gate electrode of which first transistor is connected to said first circuit.

3. The improved memory circuit according to claim 2, wherein said bias means comprises a second insulated gate field effect transistor, the source and drain electrodes of which are coupled between said connection point and a source of reference potential, and the gate electrode of which is coupled to a source of gate energizing potential.

4. The improved memory circuit according to claim 3, wherein said second field effect transistor is of the depletion type, and the gate electrode thereof is connected to said source of reference potential.

5. The improved memory circuit according to claim 3, wherein said second field effect transistor is of the enhancement type.

6. The improved memory circuit according to claim 3, wherein said first circuit comprises a decoder circuit.

7. A memory circuit comprising:

at least one memory cell for storing information;

a first circuit for supplying memory cell selection signals for accessing a memory cell;

an address signal source for generating an address signal to control said at least one memory cell;

a source follower type driver circuit for selectively gating said address signal to said at least one memory cell in response to said selection signal, comprising a first field effect transistor of the enhancement type having its gate electrode connected to said first circuit, its source electrode connected to said at least one memory cell, and its drain electrode connected to said address signal source, and a second field effect transistor of the depletion type having its gate and source electrodes connected to a source of reference potential and its drain electrode connected to said source electrode of said first field effect transistor, thereby preventing the potential of the connection point between said source electrode of said first field effect transistor and said drain of electrode of said second field transistor from floating at least when said first field effect transistor is turned off.

8. The improved memory circuit according to claim 7, wherein said first circuit includes a plurality of enhancement type insulated gate field effect transistors connected in parallel for switching, and a depletion type insulated gate field effect transistor the gate and drain electrodes of which are connected to said plural enhancement type insulated gate field effect transistors for operating as a common load for said plural transistors.

* * * * *